United States Patent
Tang et al.

(10) Patent No.: US 8,331,485 B2
(45) Date of Patent: Dec. 11, 2012

(54) SPUR CANCELLATION IN A DIGITAL BASEBAND TRANSMIT SIGNAL USING CANCELLING TONES

(75) Inventors: Yiwu Tang, San Diego, CA (US); Chiewcharn Narathong, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 258 days.

(21) Appl. No.: 12/822,930

(22) Filed: Jun. 24, 2010

(65) Prior Publication Data

US 2011/0007839 A1    Jan. 13, 2011

Related U.S. Application Data

(60) Provisional application No. 61/224,013, filed on Jul. 8, 2009.

(51) Int. Cl.
*H04K 1/02* (2006.01)
*H04L 25/03* (2006.01)
*H04L 25/49* (2006.01)

(52) U.S. Cl. ........ 375/296; 375/297; 375/219; 375/221; 375/222; 375/285; 455/78; 455/63.1; 455/570

(58) Field of Classification Search ................... 375/296, 375/295, 219, 221, 222, 285, 297; 455/78, 455/63.1, 570
See application file for complete search history.

(56) References Cited

U.S. PATENT DOCUMENTS

| | | | |
|---|---|---|---|
| 6,801,581 B1 | 10/2004 | Francos et al. | |
| 6,819,720 B1 * | 11/2004 | Willetts | ......................... 375/296 |
| 7,567,610 B2 * | 7/2009 | Adan et al. | ..................... 375/219 |
| 8,036,606 B2 * | 10/2011 | Kenington | ....................... 455/78 |
| 8,081,711 B2 * | 12/2011 | Lee et al. | ....................... 375/296 |
| 2004/0136470 A1 | 7/2004 | DeBruyn et al. | |

FOREIGN PATENT DOCUMENTS

| | | |
|---|---|---|
| EP | 0998026 | 5/2000 |
| WO | WO2010011977 | 1/2010 |

OTHER PUBLICATIONS

International Search Report and Written Opinion—PCT/US2010/041437, International Search Authority—European Patent Office—Oct. 29, 2010.

* cited by examiner

*Primary Examiner* — Phuong Phu
(74) *Attorney, Agent, or Firm* — S. Hossain Beladi

(57) ABSTRACT

A method for reducing spurs within a transmit signal is disclosed. A cancelling tone is determined. The cancelling tone is added to a baseband transmit signal in the digital domain to obtain a baseband transmit signal with cancelling tone. A spur in the transmit signal is reduced using the cancelling tone. The transmit signal with the reduced spur is transmitted using an antenna.

30 Claims, 10 Drawing Sheets

SPUR CANCELLATION IN A DIGITAL BASEBAND TRANSMIT SIGNAL USING CANCELLING TONES

RELATED APPLICATIONS

This application is related to and claims priority from U.S. Provisional Patent Application Ser. No. 61/224,013, filed on Jul. 8, 2009 for "Transmitter Phase-Locked Loop Spur Cancellation With Digital Baseband Through Transmitter Digital to Analog Converter."

TECHNICAL FIELD

The present disclosure relates generally to communication systems. More specifically, the present disclosure relates to systems and methods for spur cancellation in a digital baseband transmit signal using cancelling tones.

BACKGROUND

Wireless communication systems are widely deployed to provide various types of communication content such as voice, video, data, and so on. These systems may be multiple-access systems capable of supporting simultaneous communication of multiple wireless communication devices with one or more base stations.

Digital signal processing provides benefits to wireless communication systems and devices. However, the use of digital signal processing may require a digital to analog converter (DAC) to convert the digital signals to analog signals prior to transmission. Furthermore, the converted analog signals may need a frequency adjustment prior to transmission. The frequency adjustment may be accomplished using a local oscillator and a mixer. The local oscillator may generate a local oscillating frequency which is then mixed with the converted analog signals to obtain a transmit signal with the proper frequency.

The local oscillator may use digital components to generate the local oscillating frequency. The digital components may operate using a digital clock. The digital clock may cause interference signals (also referred to as spurs) to appear on the local oscillating frequency at frequency intervals of the digital clock. For example, a phase locked loop (PLL) may create spurs. Spurs may degrade the receiver band noise and cause the wireless communication device to fail out-of-band emission specifications.

Various spur reduction techniques exist. Some of the approaches include improving isolation through guard rings and deep n-wells, reducing power supply (Vdd) current magnetic coupling with local regulators and decoupling capacitors, changing spur frequency with programmable reference and filtering the spurs in the transmitter (Tx) or receiver (Rx) signal paths. For example, the spurs may be removed from the transmit signal using a surface acoustic wave (SAW) filter. Benefits may be realized by reducing or removing spurs without the use of a SAW filter.

SUMMARY

A method for reducing spurs within a transmit signal is disclosed. A cancelling tone is determined. The cancelling tone is added to a baseband transmit signal in the digital domain to obtain a baseband transmit signal with cancelling tone. A spur in the transmit signal is reduced using the cancelling tone. The transmit signal is transmitted with the reduced spur using an antenna.

Determining a cancelling tone may include selecting a frequency of the cancelling tone. Determining a cancelling tone may also include determining an amplitude of the cancelling tone. Determining a cancelling tone may further include selecting a phase of the cancelling tone. The baseband transmit signal with cancelling tone may be converted from a digital signal to an analog signal using a digital to analog converter (DAC). A local oscillator signal may be mixed with the baseband transmit signal with cancelling tone to obtain a mixed transmit signal. The local oscillator signal may add a spur into the transmit signal.

The local oscillator signal may be generated using a voltage controlled oscillator (VCO) and a phase locked loop (PLL). A spur in the mixed transmit signal may be reduced by the cancelling tone. An amplitude of a spur may be determined in a received signal. An amplitude of the cancelling tone may be adjusted to match the amplitude of the spur. The method may be iteratively repeated to optimize spur reduction in the transmit signal. The received signal may be received from a duplexer.

Determining the amplitude of the spur in the received signal may include mixing the received signal with a receiver local oscillator signal at spur frequency to obtain a mixed received signal. Determining the amplitude of the spur in the received signal may also include filtering the mixed received signal. Determining the amplitude of the spur in the received signal may further include converting the mixed received signal from an analog signal to a digital signal using an analog to digital converter (ADC). Determining the amplitude of the spur in the received signal may also include determining the amplitude of the spur using digital signal processing. A mobile station modem (MSM) may set the magnitude of a gain applied to the cancelling tone.

The frequency of the baseband transmit signal may be shifted to obtain the cancelling tone. The cancelling tone may be amplified using a variable gain amplifier. There may be spurs at multiple frequencies.

The cancelling tone may have a non-flat top to compensate for baseband filter attenuation over frequency. The spur may be a single tone spur and the cancelling tone may be a single tone cancelling tone. The spur may be a wideband spur and the cancelling tone may be a wideband canceling sideband. The method may be performed on a wireless communication device. The method may be performed by a transmit signal chain without a surface acoustic wave (SAW) filter.

A wireless device configured for reducing spurs within a transmit signal is also described. The wireless device includes circuitry configured to determine a cancelling tone. The wireless device also includes circuitry configured to add the cancelling tone to a baseband transmit signal in the digital domain to obtain a baseband transmit signal with cancelling tone. The wireless device further includes circuitry configured to reduce a spur in the transmit signal using the cancelling tone. The wireless device also includes a transmitter configured to transmit the transmit signal with the reduced spur.

The wireless device may include a digital to analog converter (DAC) used to convert the baseband transmit signal with cancelling tone from a digital signal to an analog signal using. The wireless device may also include a mixer used to mix a local oscillator signal with the baseband transmit signal with cancelling tone to obtain a mixed transmit signal. The local oscillator signal may add a spur into the transmit signal. The wireless device may further include a voltage controlled oscillator (VCO) and a phase locked loop (PLL) used to generate the local oscillator signal. The wireless device may also include an adjustable amplifier configured to adjust an amplitude of the cancelling tone to match an amplitude of the spur.

The wireless device may further include a duplexer used to receive the received signal. The circuitry may be further configured to determine the amplitude of the spur in the received signal. A mobile station modem (MSM) may set the magnitude of a gain applied to the cancelling tone.

A wireless device configured for reducing spurs within a transmit signal is also described. The wireless device includes means for determining a cancelling tone. The wireless device also includes means for adding the cancelling tone to a baseband transmit signal in the digital domain to obtain a baseband transmit signal with cancelling tone. The wireless device further includes means for reducing a spur in the transmit signal using the cancelling tone. The wireless device also includes means for transmitting the transmit signal with the reduced spur using an antenna.

A computer-readable medium encoded with computer-executable instructions is described. Execution of the computer-executable instructions is for determining a cancelling tone. Execution of the computer-executable instructions is also for adding the cancelling tone to a baseband transmit signal in the digital domain to obtain a baseband transmit signal with cancelling tone. Execution of the computer-executable instructions is further for reducing a spur in the transmit signal using the cancelling tone. Execution of the computer-executable instructions is also for transmitting the transmit signal with the reduced spur using an antenna.

DETAILED DESCRIPTION

Figure 1:
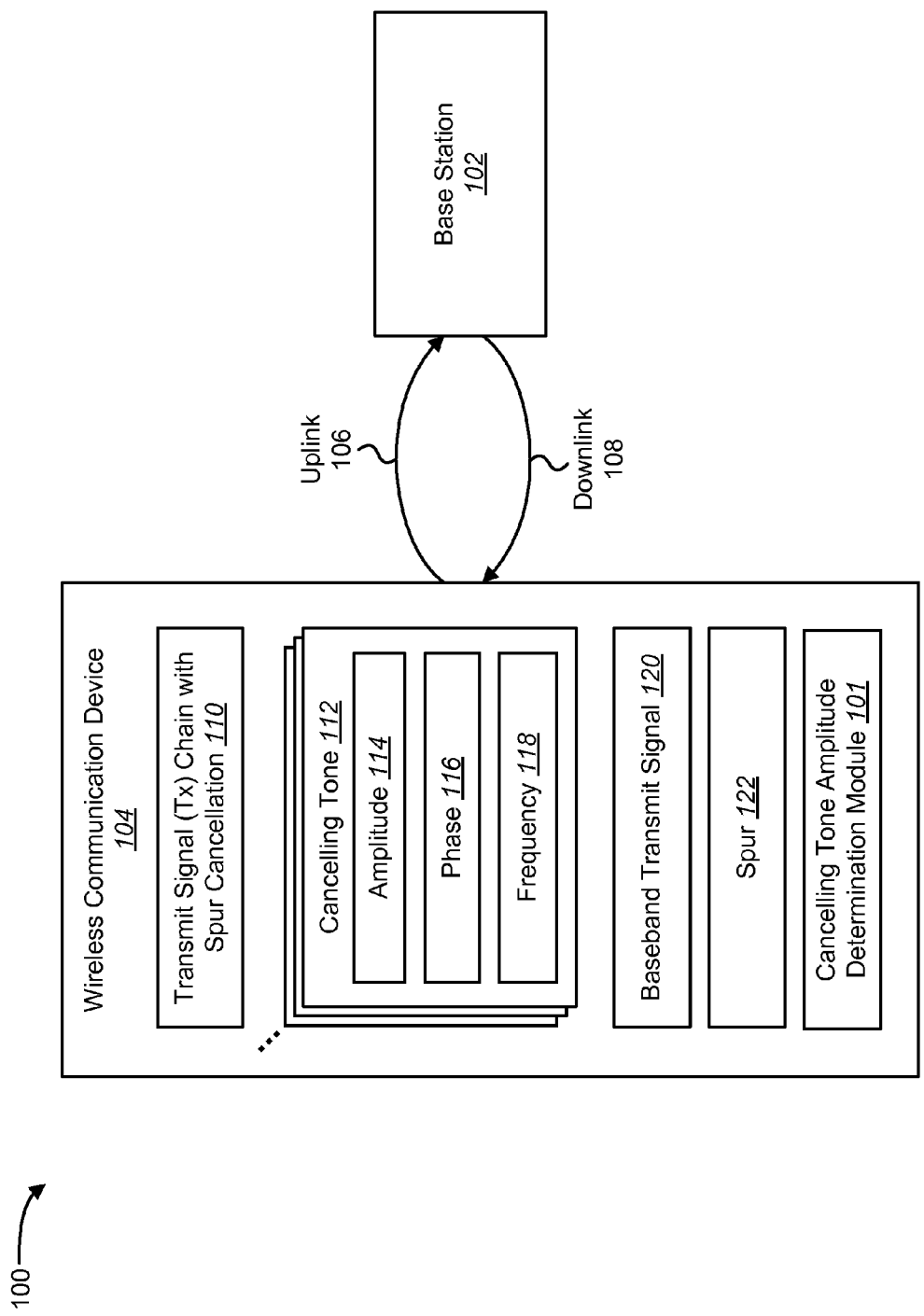
FIG. 1 shows a wireless communication system with multiple wireless devices.

FIG. 1 shows a wireless communication system 100 with multiple wireless devices. A wireless device may be a base station 102, a wireless communication device 104, or the like. A base station 102 is a station that communicates with one or more wireless communication devices 104. A base station 102 may also be referred to as, and may include some or all of the functionality of, an access point, a broadcast transmitter, a Node B, an evolved Node B, etc. Each base station 102 provides communication coverage for a particular geographic area. The term "cell" can refer to a base station 102 and/or its coverage area depending on the context in which the term is used.

A wireless communication device 104 may also be referred to as, and may include some or all of the functionality of, a terminal, an access terminal, a user equipment (UE), a mobile device, a subscriber unit, a station, etc. A wireless communication device 104 may be a cellular phone, a personal digital assistant (PDA), a wireless device, a wireless modem, a handheld device, a laptop computer, etc. A wireless communication device 104 may communicate with zero, one, or multiple base stations 102 on the downlink 108 and/or uplink 106 at any given moment using an antenna. The downlink 108 (or forward link) refers to the communication link from a base station 102 to the wireless communication device 104, and the uplink 106 (or reverse link) refers to the communication link from the wireless communication device 104 to the base station 102.

Wireless communication systems 100 may be multiple-access systems capable of supporting communication with multiple users by sharing the available system resources (e.g., bandwidth and transmit power). Examples of such multiple-access systems include code division multiple access (CDMA) systems, wideband code division multiple access (WCDMA), time division multiple access (TDMA) systems, frequency division multiple access (FDMA) systems, orthogonal frequency division multiple access (OFDMA) systems, and spatial division multiple access (SDMA) systems.

The wireless communication device 104 may include a transmit signal (Tx) chain with spur cancellation 110. The transmit signal (Tx) chain with spur cancellation 110 is discussed in additional detail below in relation to FIG. 2. The transmit signal (Tx) chain with spur cancellation 110 may cancel spurs 122 within a transmit signal. A spur 122 may be a tone within the transmit signal chain (Tx) of the wireless communication device 104 that interferes with the transmit signal. A spur 122 may also be referred to as a spurious tone or an interfering tone. A spur 122 may be a single tone at one specific frequency. A spur 122 may also be multiple tones within a frequency range. The transmit signal in a wireless communication device 104 may include one or more spurs 122.

A spur 122 in the transmit signal may be caused by digital circuitry within the wireless communication device 104. For example, a phase locked loop (PLL) with a clock frequency may generate a spur 122. One way that a spur 122 may be introduced to the transmit signal in the wireless communication device 104 is by a local oscillator. The local oscillator may include a PLL and a voltage controlled oscillator (VCO). Both the PLL and the VCO may generate a spur 122 within the local oscillation frequency produced by the local oscillator. When the local oscillation frequency is mixed with the transmit signal prior to transmission, the spur 122 may be mixed with the transmit signal.

Spurs are traditionally cancelled using a surface acoustic wave (SAW) filter. However, a SAW filter may increase the cost of the wireless communication device 104, use additional board space and attenuate the transmit signal power. To cancel or reduce the effect of spurs 122, the wireless communication device 104 may introduce one or more cancelling tones 112 to the baseband transmit signal 120. The baseband transmit signal 120 may refer to the transmit signal in the digital domain prior to modulation. A cancelling tone 112 may be at the same frequency 118 as a spur 122 but with a different phase 116. By adjusting the phase 116 and amplitude 114 of a cancelling tone 112, the cancelling tone 112 and the spur 122 may cancel each other. Thus, a cancelling tone 112 may reduce or remove a spur 122 from the transmit signal. The phase of a spur 122 is generally deterministic, depending typically on a phase relation between a temperature-controlled crystal oscillator (TCXO), for example, and a transmitter digital to analog converter (DAC) sampling clock.

By using cancelling tones 112 to reduce spurs 122, neither extra hardware nor extra current consumption is required. In addition, multiple spurs 122 may be canceled at the same time using multiple cancelling tones 112 in the digital baseband transmit signal 120. A one time power-up calibration for cancelling tone amplitude may be needed for part to part variation in a transmit signal/received signal feedback loop. The spur 122 cancellation using the cancelling tones 112 may be applied to voltage controlled oscillators (VCOs) to cancel spurs at a local oscillator (LO) directly for a DAC-VCO architecture. In this case, baseband filter frequency response compensation is not needed. The cancellation may be independent of the modulated signal bandwidth.

The wireless communication device 104 may include a cancelling tone amplitude determination module 101. The cancelling tone amplitude determination module 101 may determine the amplitude of a spur 122 for cancellation using feedback from received signals. The cancelling tone amplitude determination module 101 is discussed in additional detail below in relation to FIG. 6.

Figure 2:
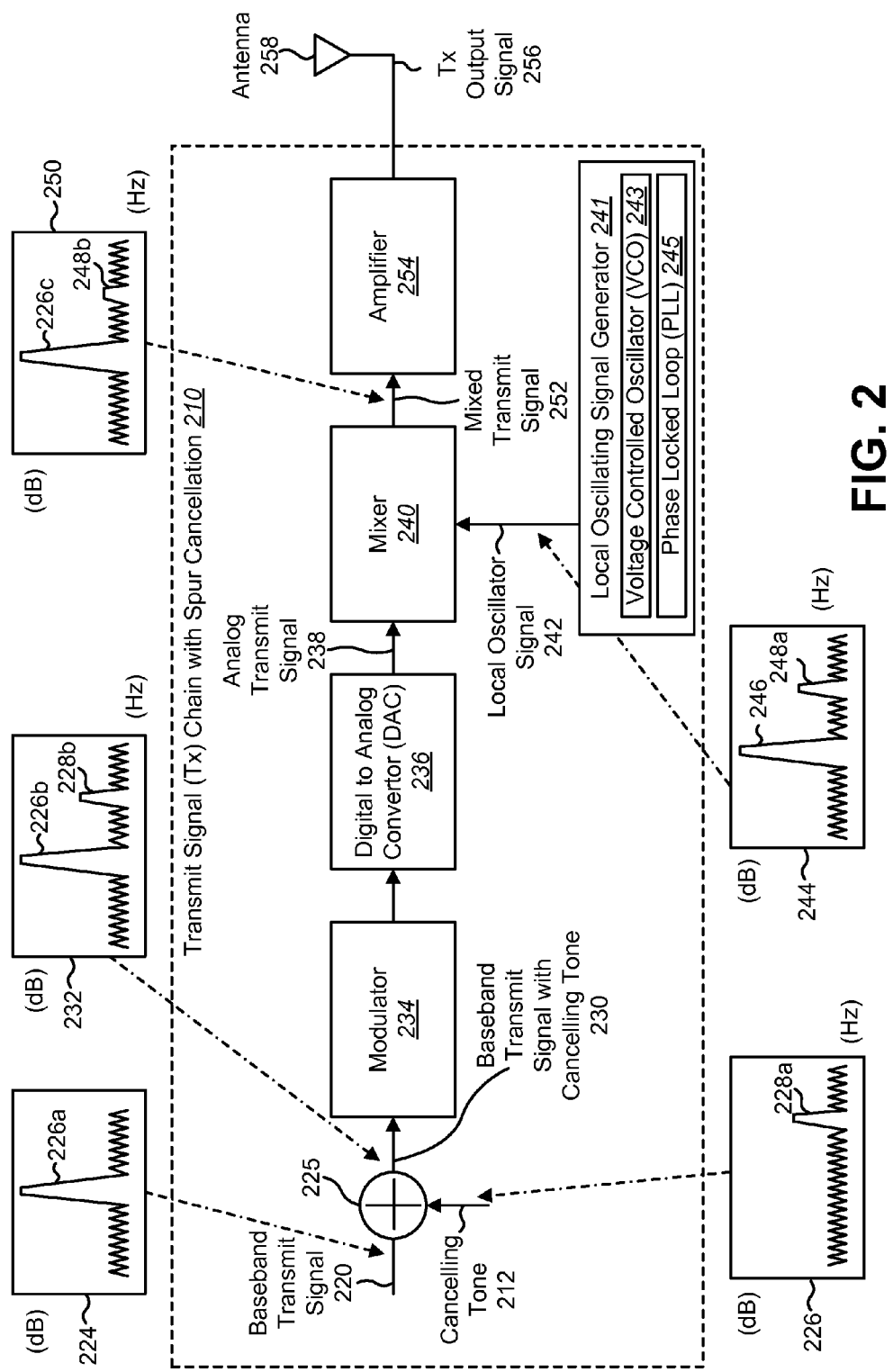
FIG. 2 is a block diagram illustrating the addition of cancelling tones to a baseband transmit signal within a transmit signal (Tx) chain with spur cancellation.

FIG. 2 is a block diagram illustrating the addition of cancelling tones 212 to a baseband transmit signal 220 within a transmit signal (Tx) chain with spur cancellation 210. The transmit signal (Tx) chain with spur cancellation 210 may be located on a wireless communication device 104. The transmit signal (Tx) chain with spur cancellation 210 may receive a baseband transmit signal 220. The baseband transmit signal 220 may be in the digital domain. A graph 224 of one configuration of the baseband transmit signal 220 is shown. The baseband transmit signal 220 may include a direct current (DC) signal 226a.

Cancelling tones 212 may be added to the baseband transmit signal 220. A graph 226 is shown illustrating a single cancelling tone 228a. In one configuration, the cancelling tones 212 may be added to the baseband transmit signal 220 using digital signal processing. For example, the cancelling tones 212 may be added to the baseband transmit signal 220 using an adder 225. One or more cancelling tones 212 may be added to the baseband transmit signal 220. In one configuration, a single cancelling tone 212 may be added to the baseband transmit signal 220 to reduce/remove a single spur 122. In another configuration, a wideband cancelling sideband may be added to the baseband transmit signal 220 to reduce/remove a wideband spur 122.

The frequency of spurs 122 within the transmit signal (Tx) chain with spur cancellation 210 may be known by the wireless communication device 104. For example, a wireless communication device 104 may know the frequencies of local oscillators used in the transmit signal (Tx) chain which cause spurs 122. The spurs 122 may be multiples of the local oscillator frequency. In one configuration, a local oscillator with a 20 megahertz (MHz) frequency may produce spurs 122 that are multiples of 20 MHz. The transmit signal (Tx) chain with spur cancellation 210 may cancel the spurs of interest (e.g., those that are within the range of a receiver input signal bandwidth and those that will violate out-of-band emission requirements).

The adder 225 may output a baseband transmit signal with cancelling tone 230. The baseband transmit signal with cancelling tone 230 may then be input to a modulator 234. One configuration of the baseband transmit signal with cancelling tone 230 is illustrated in graph 232. The baseband transmit signal with cancelling tone 230 may include both a DC signal 226b and a cancelling tone 228b. After modulation, a digital to analog converter (DAC) 236 may convert the baseband transmit signal with cancelling tone 230 from a digital signal to an analog transmit signal 238.

A mixer 240 may mix a local oscillator signal 242 with the analog transmit signal 238. One configuration of a local oscillator signal 242 is illustrated in graph 244. The local oscillator signal 242 may be generated by a local oscillating signal generator 241. The local oscillating signal generator 241 may include a voltage controlled oscillator (VCO) 243 and a phase locked loop (PLL) 245. The local oscillator signal 242 may include a local oscillator frequency 246 and one or more spurs 248a at multiples of the local oscillator frequency 246. The mixer 240 outputs a mixed transmit signal 252. One configuration of the mixed transmit signal 252 is illustrated in graph 250. The mixed transmit signal 252 may include an upconverted DC signal 226c and a composite spur 248b. The composite spur 248b may be a reduced version of the spur 248a within the local oscillator signal 242. An amplifier 254 amplifies the mixed transmit signal 252 to obtain a Tx output signal 256. The Tx output signal 256 is transmitted by an antenna 258.

Figure 3:
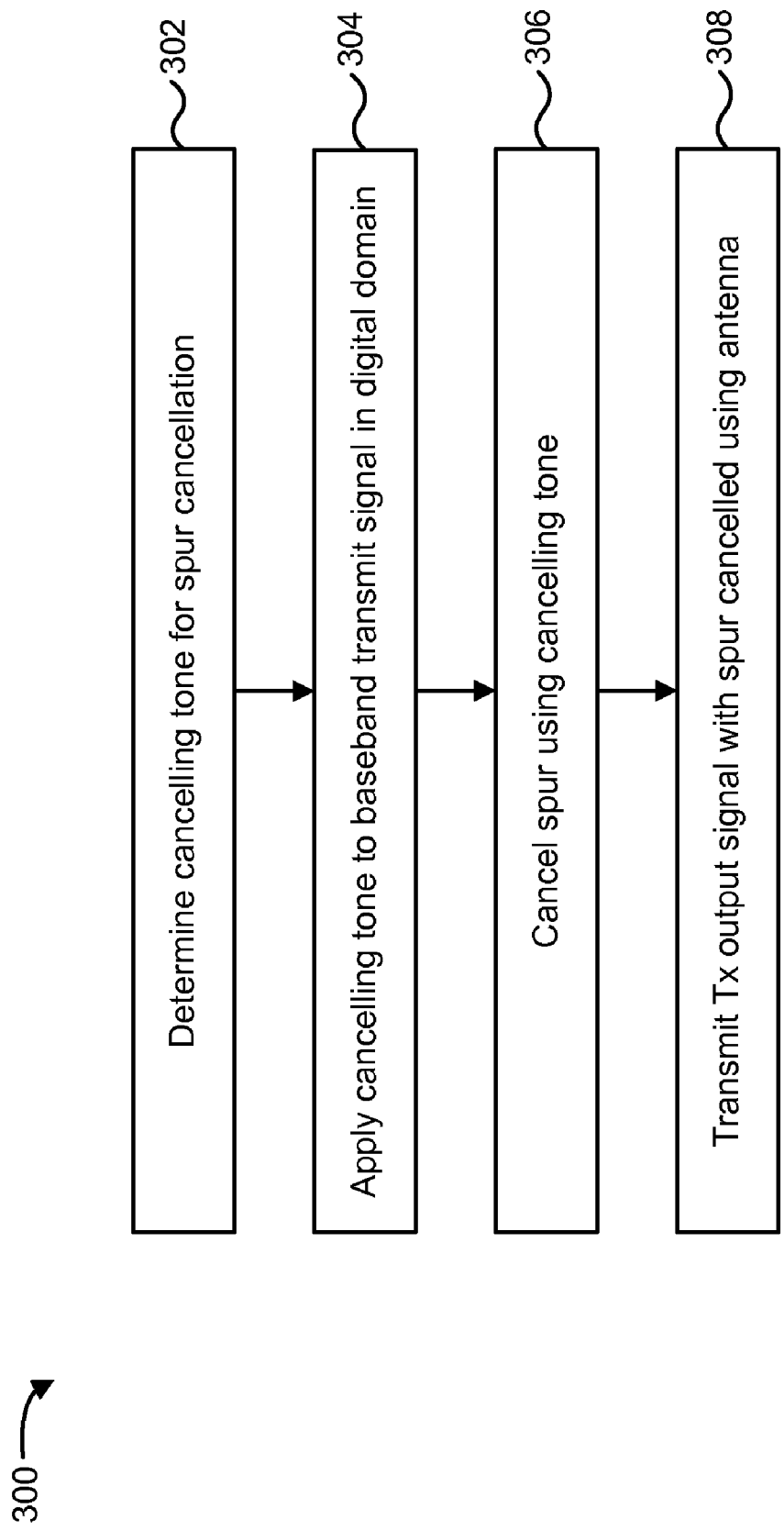
FIG. 3 is a flow diagram of a method for cancelling spurs within a transmit signal.

FIG. 3 is a flow diagram of a method 300 for cancelling spurs 122 within a transmit signal. The method 300 may be performed by a wireless communication device 104. The wireless communication device 104 may determine 302 a cancelling tone 212 for spur cancellation. In one configuration, the wireless communication device 104 may determine 302 multiple cancelling tones 212 for cancelling multiple spurs 122. The wireless communication device 104 may apply 304 the cancelling tone 212 to a baseband transmit signal 220 in the digital domain. In one configuration, the wireless communication device 104 may apply 304 the cancelling tone 212 to the baseband transmit signal 220 using an adder. The wireless communication device 104 may then cancel 306 a spur 122 using the cancelling tone 212. For example, the phase 116 and amplitude 114 of the cancelling tone 212 may offset the spur 122. In one configuration, the cancelling tone 212 may reduce the spur 122 by approximately 25 decibels (dB). The wireless communication device 104 may transmit 308 the Tx output signal 256 with the spur 122 cancelled using an antenna 258.

Figure 4:
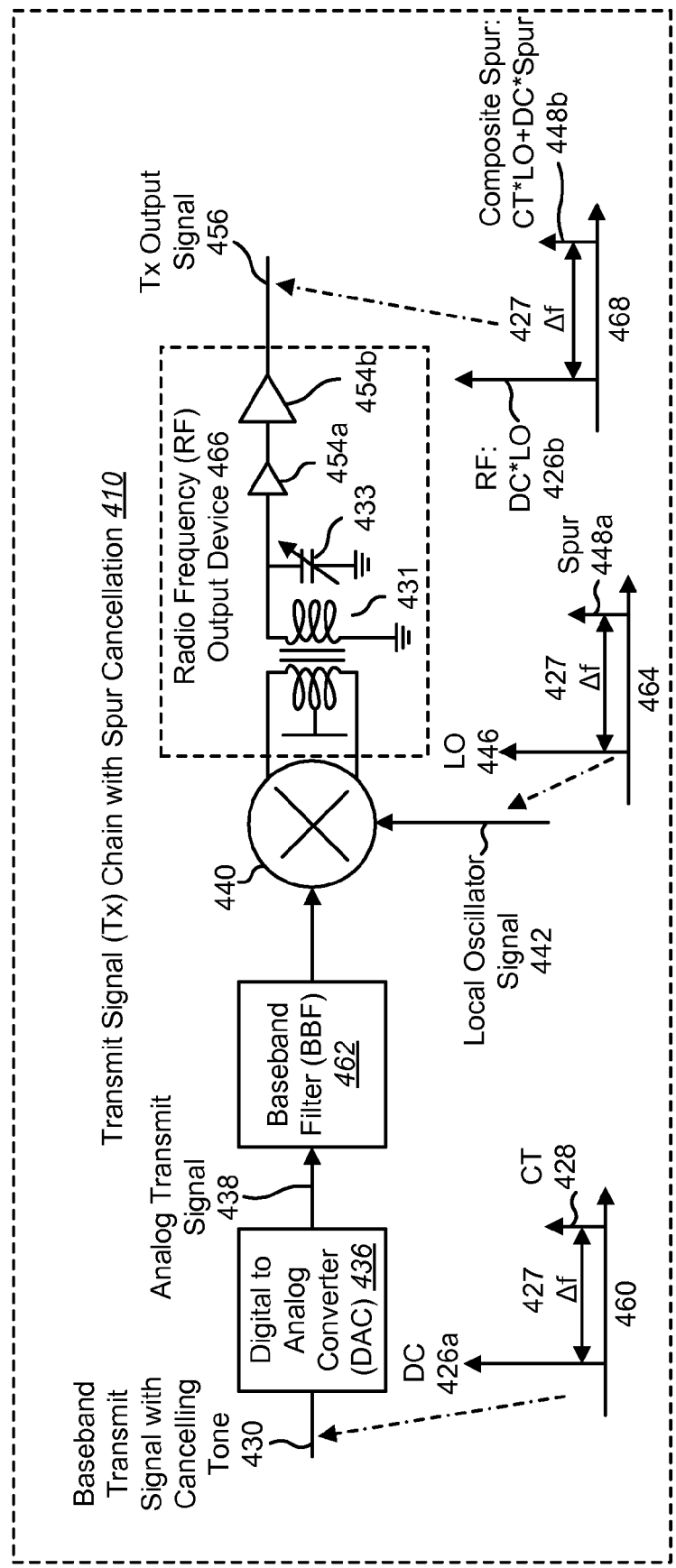
FIG. 4 is a block diagram illustrating a transmit signal (Tx) chain with spur cancellation.

FIG. 4 is a block diagram illustrating a transmit signal (Tx) chain with spur cancellation 410. The transmit signal (Tx) chain with spur cancellation 410 of FIG. 4 may be one configuration of the transmit signal (Tx) chain with spur cancellation 110 of FIG. 1. A baseband transmit signal with cancelling tone 430 may be provided to a digital to analog converter (DAC) 436. The baseband transmit signal with cancelling tone 430 may be in the digital domain. Graph 460 illustrates one configuration of the baseband transmit signal with cancelling tones 430 having a direct current (DC) signal 426a and a cancelling tone (CT) 428. The DC signal 426a and the cancelling tone 428 may be separated by a frequency difference $\Delta f$ 427. The digital to analog converter (DAC) 436 may convert the baseband transmit signal with cancelling tone 430 to an analog transmit signal 438 in the analog domain. The analog transmit signal 438 may be passed through a baseband filter (BBF) 462.

The output of the baseband filter (BBF) 462 may be provided to a mixer 440. In one configuration, the mixer 440 may be an upconverter. The mixer 440 may also receive a local oscillator signal 442. The local oscillator signal 442 may be generated by a local oscillator (not shown) within the wireless communication device 104. In one configuration, the local oscillator may include a phase locked loop (PLL) (not shown) and a voltage controlled oscillator (VCO) (not shown). The local oscillator signal 442 may include a local oscillator frequency (LO) 446 and one or more spurs 448a. Graph 464 illustrates the local oscillator frequency (LO) 446 and a corresponding spur 448a. The local oscillator frequency (LO) 446 and the spur 448a may also be separated by a frequency difference $\Delta f$ 427.

The output of the mixer 440 may be provided to a radio frequency (RF) output device 466. In one configuration, the radio frequency (RF) output device 466 may include a transformer 431, a variable capacitor 433, a driver amplifier 454a and a power amplifier 454b. The radio frequency (RF) output device 466 may output a Tx output signal 456. Graph 468 illustrates one configuration of the Tx output signal 456. The Tx output signal 456 may include a radio frequency (RF) signal 426b. The radio frequency (RF) signal 426b may include both the DC signal 426a and the local oscillator frequency (LO) 446. For example, the radio frequency (RF) signal 426b may include the DC signal 426a multiplied by the LO 446: DC*LO.

The Tx output signal 456 may also include a composite spur 448b. The composite spur 448b may include the cancelling tone (CT) 428 multiplied by the local oscillator frequency (LO) 446 plus the direct current (DC) signal 426a multiplied by the spur 448a. In other words, the composite spur 448b may be represented as CT*LO+DC*Spur. The composite spur 448b and the radio frequency (RF) signal 426b may also be separated by a frequency difference $\Delta f$ 427. The composite spur 448b in the Tx output signal 456 may be represented using Equation (1):

$$y_{spur\_cancel}(t) = y_{CT}(t) \cdot y_{LO}(t) + y_{DC}(t) \cdot y_{spur}(t) = A_{CT} e^{j(\omega_{CT} t + \phi_{CT})} \cdot G_{mixer} e^{j(\omega_{LO} t + \phi_{LO})} + A_{DC} \cdot A_{spur} e^{j(\omega_{spur} t + \phi_{spur})}. \quad (1)$$

In Equation (1), $A_{CT}$ is the amplitude of the cancelling tone 428, $A_{DC}$ is the amplitude of the DC signal 426a and $A_{spur}$ is the amplitude of the spur 448a. In Equation (1), $\omega_{CT}$ is the angular frequency of the cancelling tone 428, $\omega_{LO}$ is the angular frequency of the local oscillating frequency (LO) 446 and $\omega_{spur}$ is the angular frequency of the spur 448a. Also, in Equation (1), $\phi_{CT}$ is the phase of the cancelling tone 428, $\phi_{LO}$ is the phase of the local oscillating frequency 446 and $\phi_{spur}$ is the phase of the spur 448a. A spur 448a may theoretically be completely cancelled when Equation (2), Equation (3) and Equation (4) are satisfied:

$$A_{CT} \cdot G_{mixer} = A_{DC} \cdot A_{spur}. \quad (2)$$

$$\omega_{CT} + \omega_{LO} = \omega_{spur}. \quad (3)$$

$$\phi_{CT} + \phi_{LO} = 180° + \phi_{spur}. \quad (4)$$

Figure 5:
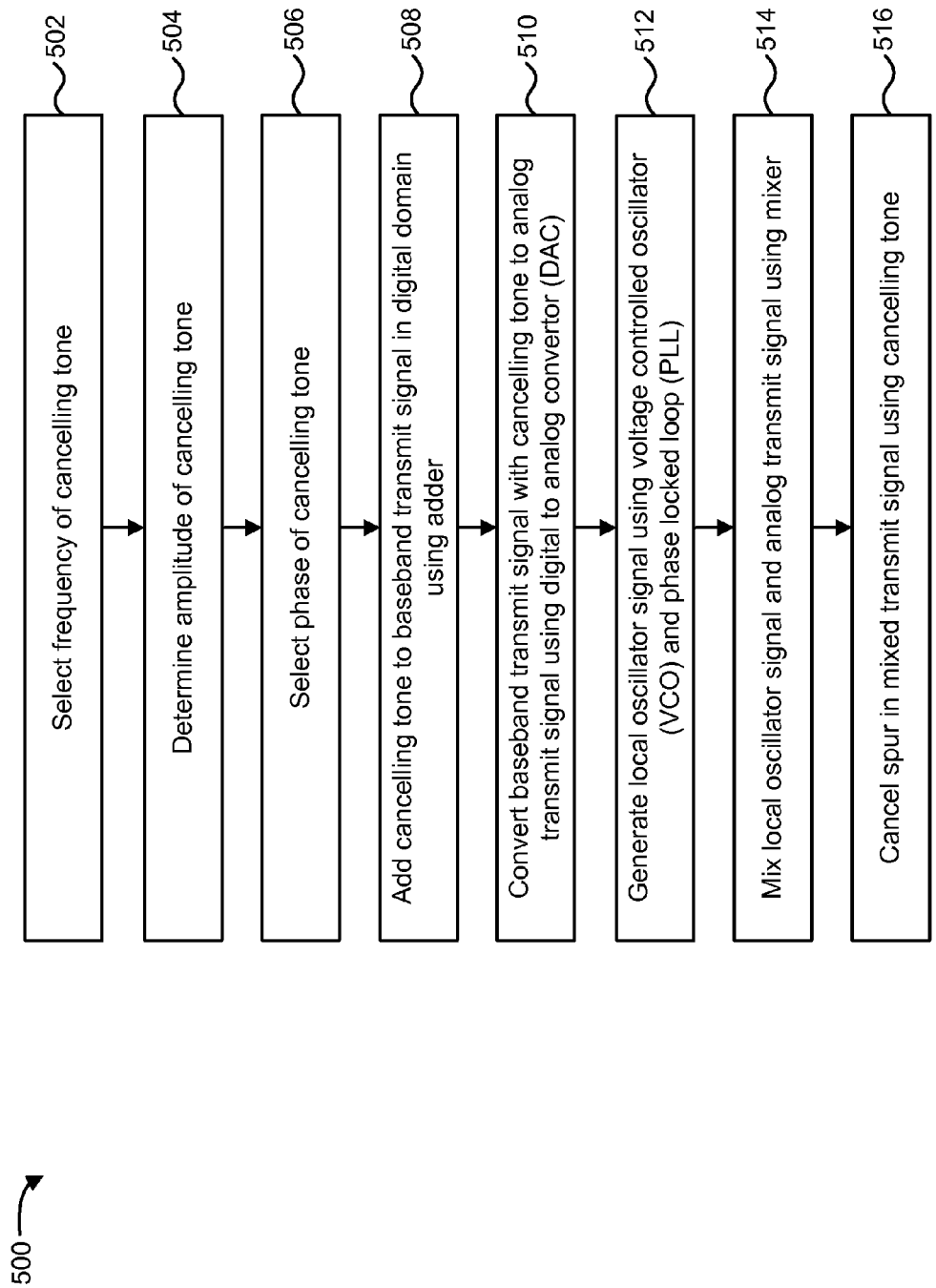
FIG. 5 is a flow diagram of another method for cancelling spurs within a transmit signal.

FIG. 5 is a flow diagram of another method 500 for cancelling spurs 122 within a transmit signal. The method 500 may be performed by a wireless communication device 104. The wireless communication device 104 may select 502 a frequency 118 of a cancelling tone 112. The frequency 118 of the cancelling tone 112 may be selected according to the known frequency of a spur 122. For example, if the frequency of a spur 122 is known to be 20 MHz, the wireless communication device 104 may select 502 the frequency 118 of the cancelling tone 112 to be 20 MHz. The wireless communication device 104 may select 502 the frequency 118 for more than one cancelling tone 112. For example, the wireless communication device 104 may select 502 the frequencies 118 for additional cancelling tones 112 that match the known frequencies of additional spurs 122.

The wireless communication device 104 may determine 504 the amplitude 114 of the cancelling tone 112. In one configuration, the wireless communication device 104 may determine 504 the amplitude 114 of the cancelling tone 112 by measuring the amplitude of a spur 122 in a received signal (Rx) chain. The wireless communication device 104 may also select 506 a phase 116 for the cancelling tone 112. The phase 116 of the cancelling tone 112 may be selected 506 to maximally reduce a spur 122. In one configuration, the phase 116 of the cancelling tone 112 may be selected 506 based on the phase of the spur 122 to be cancelled and the phase of a local oscillator signal 442 introducing the spur 448a to a transmit signal in the digital domain.

The wireless communication device 104 may add 508 the cancelling tone 112 to the baseband transmit signal 220 in the digital domain using an adder. The wireless communication device 104 may then convert 510 the baseband transmit signal with cancelling tone 530 in the digital domain to an analog transmit signal 238 using a digital to analog converter (DAC) 236. The wireless communication device 104 may next generate 512 a local oscillator signal 242 using a voltage controlled oscillator (VCO) and a phase locked loop (PLL). The local oscillator signal 242 may be used to upconvert the frequency of the analog transmit signal 238. The local oscillator signal 242 may include a spur 248a. The wireless communication device 104 may mix 514 the local oscillator signal 242 and the analog transmit signal 238 using a mixer 240 to obtain a mixed transmit signal 252. Because the analog transmit signal 238 includes the selected cancelling tone 228a, a spur 248a within the local oscillator signal 242 may be canceled 516 in the mixed transmit signal 252 when the local oscillator signal 242 and the analog transmit signal 238 are mixed.

Figure 6:
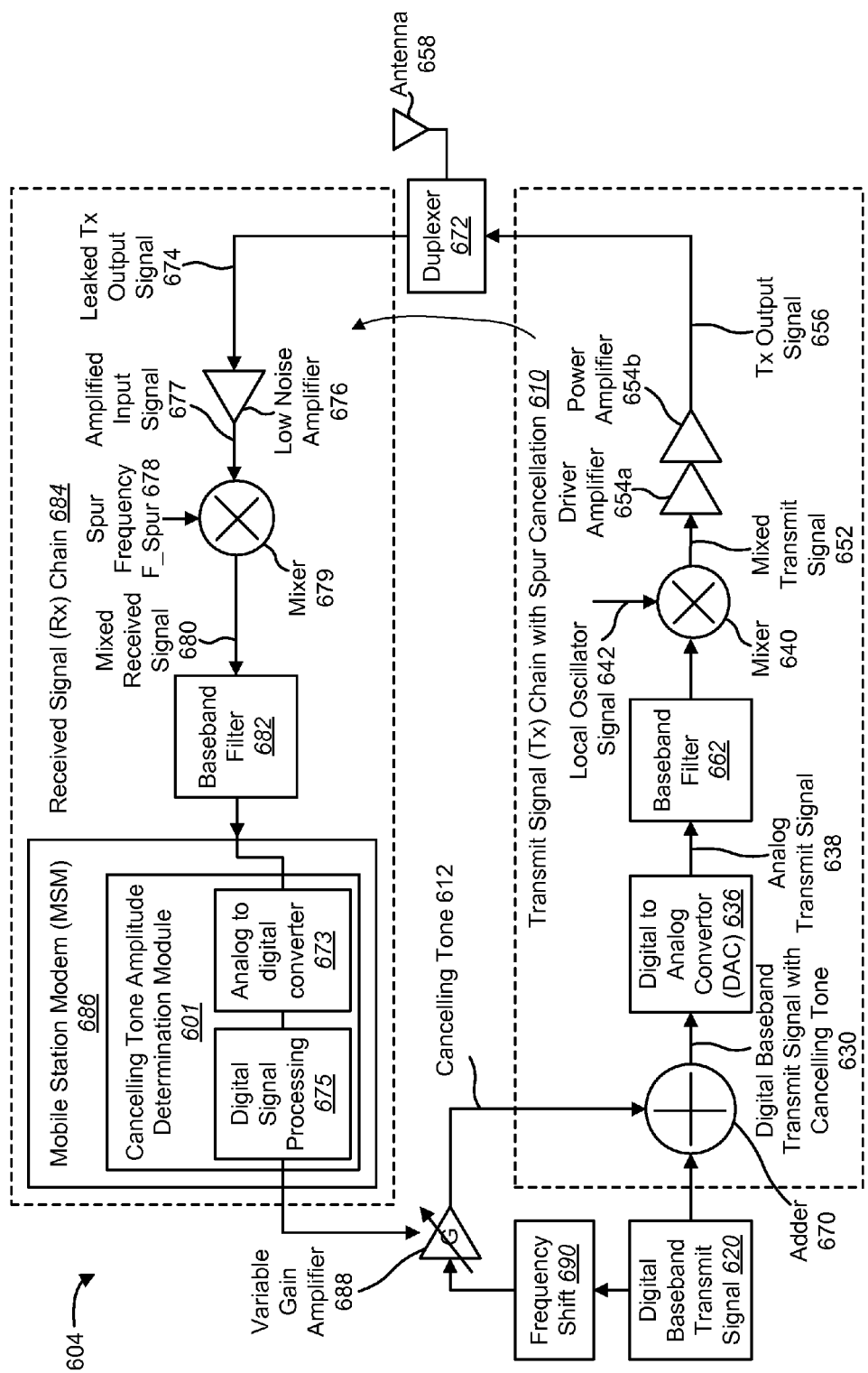
FIG. 6 is a block diagram illustrating the use of feedback to optimize the amplitude of a cancelling tone in a wireless communication device.

FIG. 6 is a block diagram illustrating the use of feedback to optimize the amplitude of a cancelling tone 612 in a wireless communication device 604. The wireless communication device 604 may include a duplexer 672 attached to an antenna 658. A receiver signal (Rx) chain 684 may receive Tx output signals 656 leaked through the duplexer 672 (here the Rx input signal comes from Tx output, not from an antenna). The duplexer 672 may leak a leaked Tx output signal 674 to a received signal (Rx) chain 684. In one configuration, the leaked Tx output signal 674 may be Tx output signals 656 received by the duplexer 672 from a transmit signal (Tx) chain with spur cancellation 610. The leaked Tx output signals 674 may be amplified using a low noise amplifier (LNA) 676. The amplified input signal 677 and a received signal local oscillator signal (Rx LO) may be mixed in a first mixer 679. The first mixer 679 may be referred to as a downconverter.

To determine the amplitude of spurs 122 within the transmit signal, the received signal local oscillator signal (Rx LO) may be tuned to the frequency of a spur F_Spur 678. The first mixer 679 may then output a mixed received signal 680. The mixed received signal 680 may be passed through a baseband filter 682 and input into an analog to digital converter (ADC) 673 in a mobile station modem (MSM) 686. The mobile station modem (MSM) 686 may be a chip with a modem on it. The mobile station modem (MSM) 686 may have digital signal processing 675 capabilities.

The mobile station modem (MSM) 686 may determine the amplitude of the spur 122 using a cancelling tone amplitude determination module 601. The mobile station modem (MSM) 686 may then adjust a cancelling tone 612 amplitude added to a digital baseband transmit signal 620 using a variable gain amplifier 688. In one configuration, the mobile station modem (MSM) 686 may adjust the cancelling tone 612 amplitude with a simple binary search algorithm to obtain a minimum spur level at transmit signals received by the duplexer 672. A cancelling tone 612 may be obtained by applying a frequency shift 690 to the digital baseband transmit signal 620. The frequency shift 690 applied to the digital baseband transmit signal 620 may adjust the frequency 118 of the cancelling tone 612 to match the known frequency of a spur 122.

The cancelling tone 612 may be added to the digital baseband transmit signal 620 using an adder 670. The digital baseband transmit signal with cancelling tone 630 may then be converted from the digital domain to the analog domain using a digital to analog converter (DAC) 636. The analog transmit signal 638 may be passed through a baseband filter 662. The analog transmit signal 638 may then be mixed with a local oscillator signal 642 in a second mixer 640. The second mixer 640 may be referred to as an upconverter. The local oscillator signal 642 may include a spur 122. As discussed above, the frequency of the spur 122 may be known to the wireless communication device 604.

The output of the mixer 640 may be referred to as the mixed transmit signal 652. The mixed transmit signal 652 may include a DC component of the digital baseband transmit signal 620 with an adjusted frequency. The mixed transmit signal 652 may also include a composite spur 248b. The composite spur 248b may be a reduced version of the spur 112 in the local oscillator signal 642. For example, the composite spur 248b may be a combination of the spur 122 in the local oscillator signal 642 and the cancelling tone 612 added to the digital baseband transmit signal 620. The mixed transmit signal 652 may be amplified with a driver amplifier 654a and a power amplifier 654b to obtain a Tx output signal 656. The Tx output signal 656 may then be input into the duplexer 672. As discussed above, the duplexer 672 may facilitate feedback by leaking the Tx output signal 656 to the received signal (Rx) chain 684 as the leaked Tx output signal 674.

Figure 7:
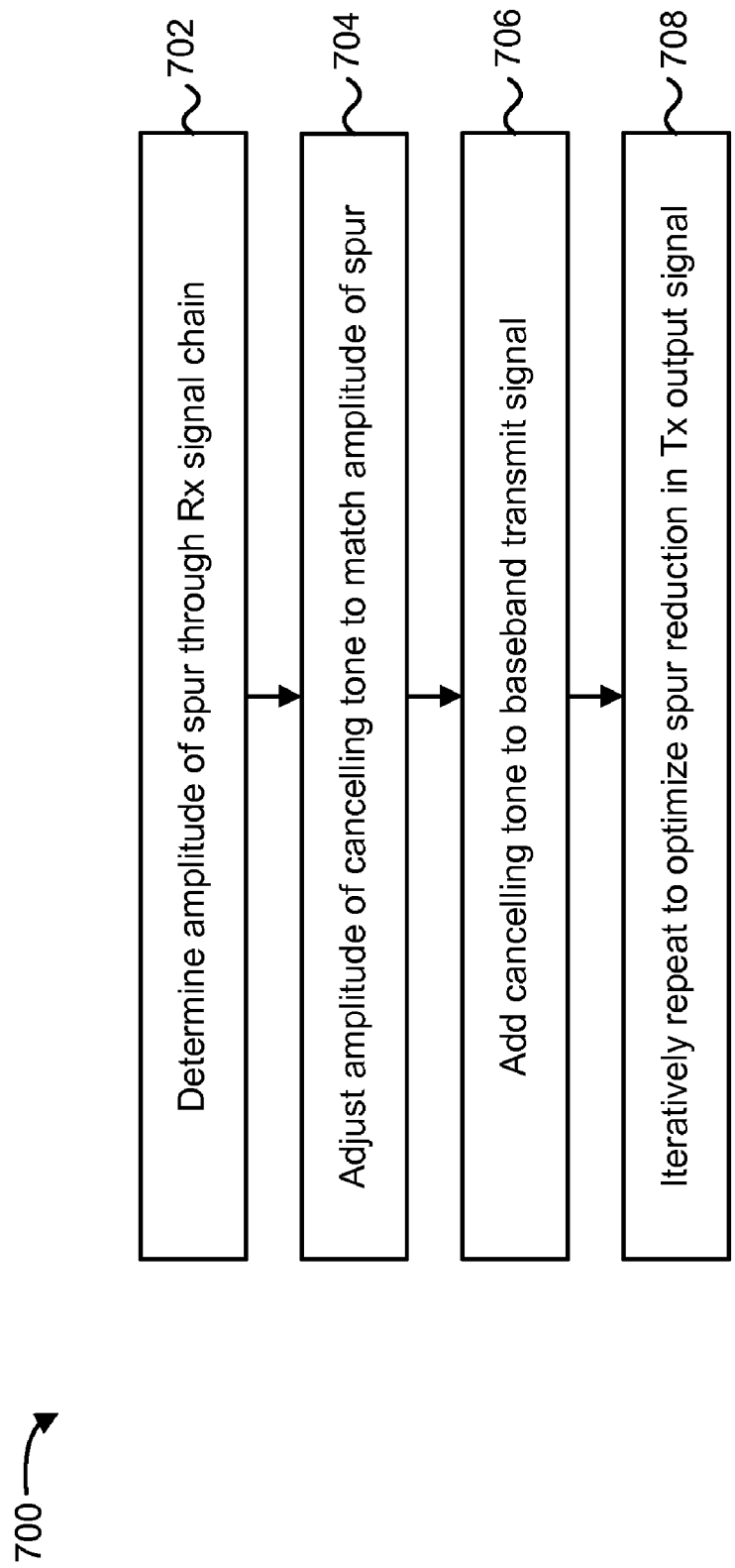
FIG. 7 is a flow diagram of a method for using feedback to optimize the amplitude of a cancelling tone in a wireless communication device.

FIG. 7 is a flow diagram of a method 700 for using feedback to optimize the amplitude 114 of a cancelling tone 612 in a wireless communication device 104. The method 700 may be performed by the wireless communication device 104. The wireless communication device 104 may determine 702 the amplitude of a spur 122 through an Rx signal chain 684. The wireless communication device 104 may then adjust 704 the amplitude 114 of a cancelling tone 612 to match the amplitude of the spur 122. The wireless communication device 104 may next add 706 the cancelling tone 612 to a baseband transmit signal 620. The wireless communication device 104 may then iteratively repeat 708 to optimize spur reduction in a Tx output signal 656.

Figure 8:
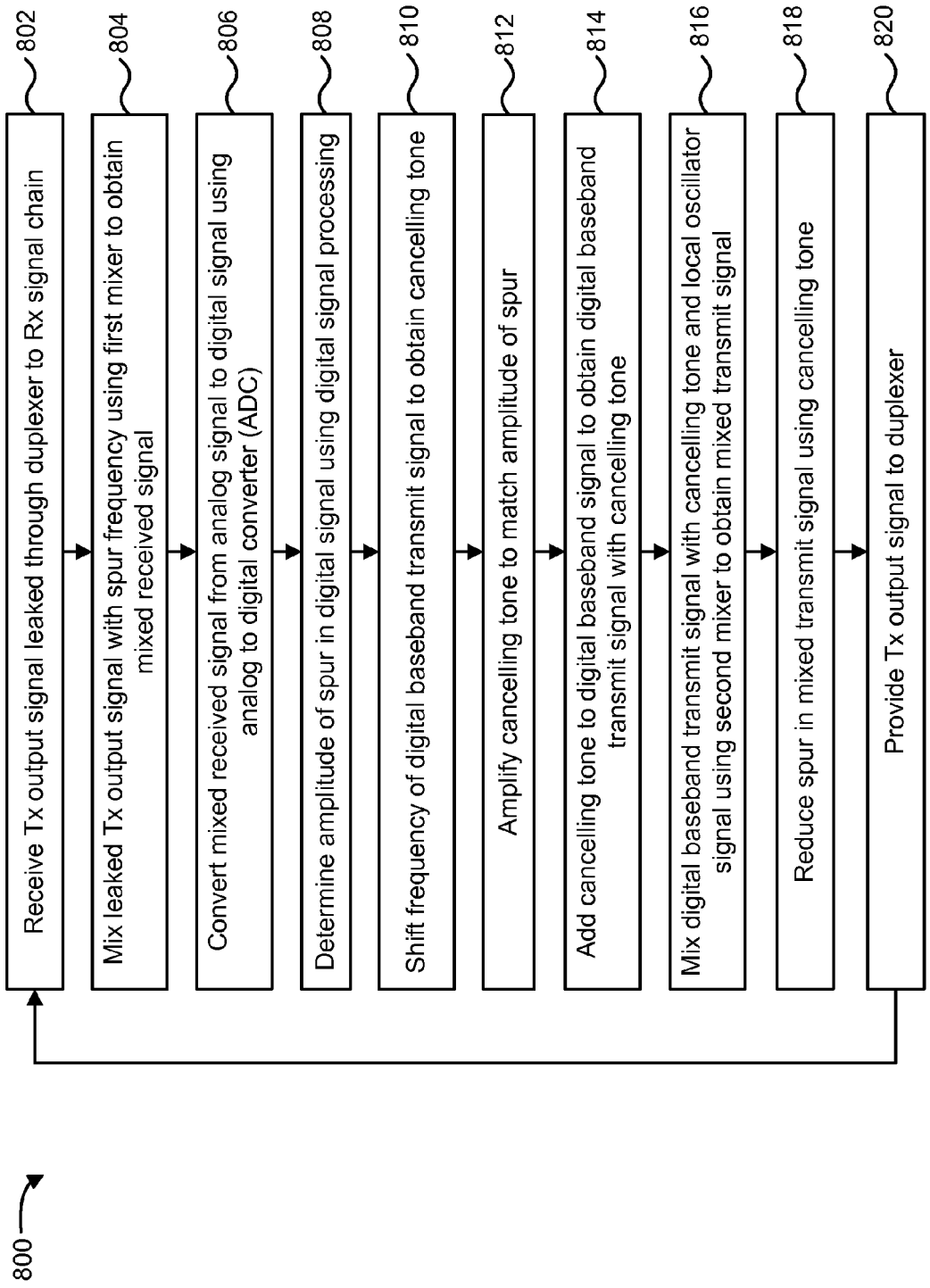
FIG. 8 is a flow diagram of another method for using feedback to optimize the amplitude of a cancelling tone in a wireless communication device.

FIG. 8 is a flow diagram of another method 800 for using feedback to optimize the amplitude 114 of a cancelling tone 612 in a wireless communication device 104. The method 800 may be performed by the wireless communication device 104. The wireless communication device 104 may receive 802 a Tx output signal 656 leaked through a duplexer 672 to a received signal (Rx) chain 684. The received Tx output signal 656 may be referred to as a leaked Tx output signal 674. The leaked Tx output signal 674 may include a spur 122.

The wireless communication device 104 may mix 804 the leaked Tx output signal 674 with a spur frequency 678 using a first mixer 679 to obtain a mixed received signal 680. The wireless communication device 104 may convert 806 the mixed received signal 680 from an analog signal to a digital signal using an analog to digital converter (ADC) 673. In one configuration, the analog to digital converter (ADC) 673 may be part of a mobile station modem (MSM) 686. The mobile station modem (MSM) 686 may include digital signal processing 675 capabilities. The wireless communication device 104 may determine 808 the amplitude of the spur 122 in the digital signal using digital signal processing. For example, the wireless communication device 104 may determine 808 the amplitude of the spur 122 using a cancelling tone amplitude determination module 601. The wireless communication device 104 may also shift 810 the frequency of a digital baseband transmit signal 620 to obtain a cancelling tone 612. The wireless communication device 104 may then amplify 812 the cancelling tone 612 to match the amplitude of the spur 122. A variable gain amplifier 688 may be used to amplify 812 the cancelling tone 612.

The wireless communication device 104 may add 814 the cancelling tone 612 to the digital baseband transmit signal 620 to obtain a digital baseband transmit signal with cancelling tone 630. The wireless communication device 104 may mix 816 the digital baseband transmit signal with cancelling tone 630 and a local oscillator signal 642 to obtain a mixed transmit signal 652. The local oscillator signal 642 may include one or more spurs 122. By mixing 816 the digital baseband transmit signal with cancelling tone 630 and the local oscillator signal 642, the wireless communication device 104 may reduce 818 the spur 122 in the mixed transmit signal 652 using the cancelling tone 612. The mixed transmit signal with the reduced spur may be referred to as the Tx output signal 656. The wireless communication device 104 may provide 820 the Tx output signal 656 to the duplexer 672. The received signal (Rx) chain 684 may then receive 802 the leaked Tx output signal 674 from the duplexer 672.

Figure 9:
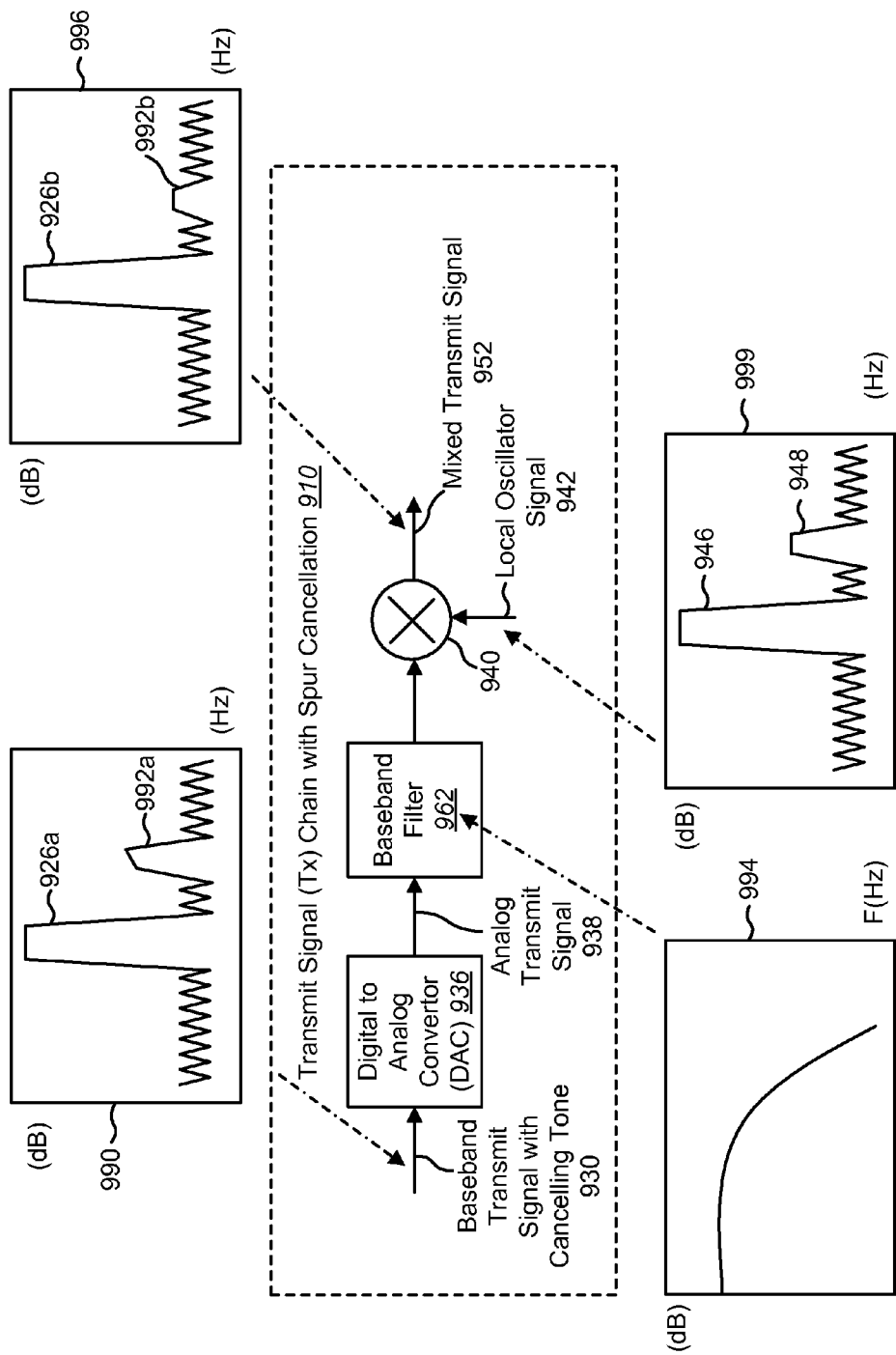
FIG. 9 is a block diagram illustrating the use of a cancelling tone with a non-flat top in a baseband transmit signal with cancelling tone as part of a transmit signal (Tx) chain with spur cancellation.

FIG. 9 is a block diagram illustrating the use of a cancelling tone 992a with a non-flat top in a baseband transmit signal with cancelling tone 930 as part of a transmit signal (Tx) chain with spur cancellation 910. The non-flat top may be a pre-warped or other non-straight line. In one configuration, the non-flat top may be a second order or higher order non-linear shape that depends on the shape of the baseband filter frequency response. One configuration of the baseband transmit signal with cancelling tone 930 is illustrated in graph 990. The baseband transmit signal with cancelling tone 930 may include a DC component 926a and a cancelling tone 992a. The cancelling tone 992a may have an non-flat top to compensate for baseband filter 962 attenuation over frequency. The frequency response of the non-flat top cancelling tone 992a may be the reverse function of the baseband filter 962 at the cancelling tone 992a frequency. After passing the non-flat top cancelling tone 992a through the baseband filter 962, the cancelling tone 992a may have a flat top.

The baseband transmit signal with cancelling tone 930 may be input into a digital to analog converter (DAC) 936. The digital to analog converter (DAC) 936 may convert the baseband transmit signal with cancelling tone 930 to an analog transmit signal 938. The analog transmit signal 938 may then be filtered using a baseband filter 962. Graph 994 illustrates the baseband frequency response (Hz) of the baseband filter 962 versus magnitude (dB). The baseband filter 962 may output a filtered analog transmit signal. The filtered analog transmit signal may be mixed with a local oscillator signal 942 by a mixer 940. Graph 999 illustrates one configuration of the local oscillator signal 942 frequency (Hz) versus magnitude (dB). The local oscillator signal 942 may include a local oscillator frequency (LO) 946 and a spur 948. The spur 948 may be located at a higher frequency than the local oscillating frequency (LO) 946.

The mixer 940 may output a mixed transmit signal 952. Graph 996 illustrates one configuration of a mixed transmit signal 952. The mixed transmit signal 952 may include the DC component 926*b* of the baseband transmit signal. The mixed transmit signal 952 may also include a composite spur 992*b*. The composite spur 992*b* may be a reduced version of the original spur 948. In one configuration, the spur 948 may be completely removed in the mixed transmit signal 952.

Figure 10:
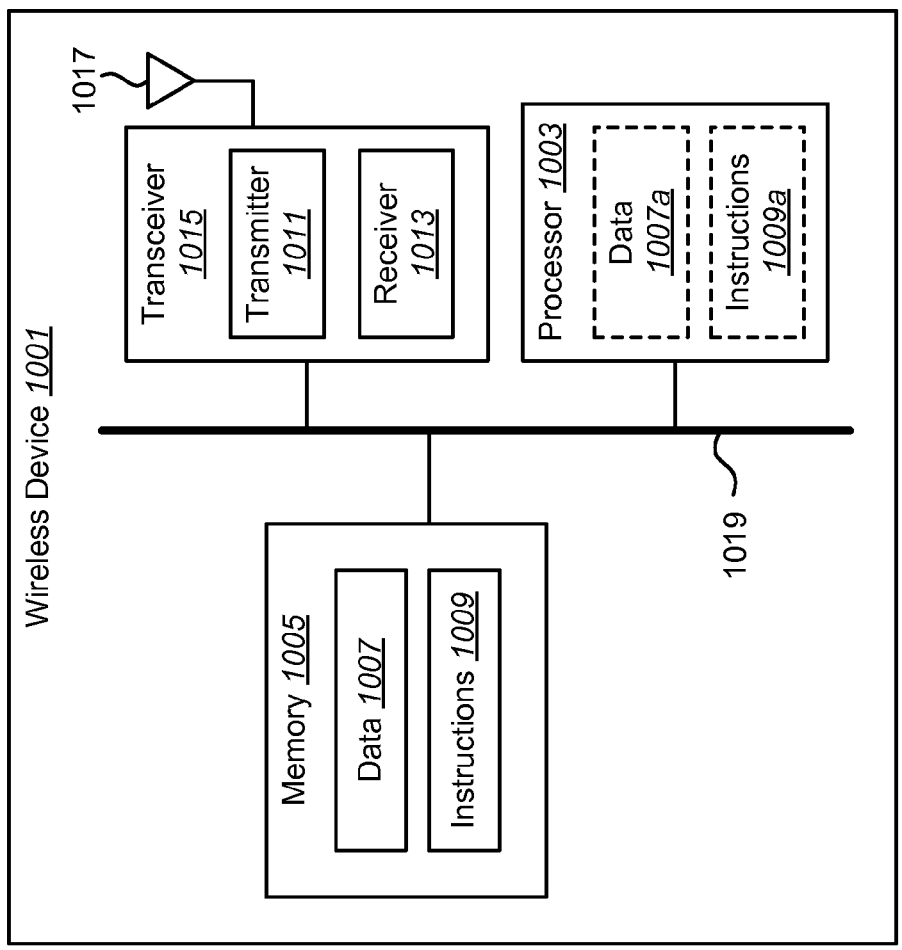
FIG. 10 illustrates certain components that may be included within a wireless device that is configured in accordance with the present disclosure.

FIG. 10 illustrates certain components that may be included within a wireless device 1001. The wireless device 1001 may be a wireless communication device 104 and may implement the present systems and methods as disclosed herein.

The wireless device 1001 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the wireless device 1001 of FIG. 10, in an alternative configuration, a combination of processors (e.g., an ARM and DSP) could be used.

The wireless device 1001 also includes memory 1005. The memory 1005 may be any electronic component capable of storing electronic information. The memory 1005 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1007 and instructions 1009 may be stored in the memory 1005. The instructions 1009 may be executable by the processor 1003 to implement the methods disclosed herein. Executing the instructions 1009 may involve the use of the data 1007 that is stored in the memory 1005. When the processor 1003 executes the instructions 1009, various portions of the instructions 1009*a* may be loaded onto the processor 1003, and various pieces of data 1007*a* may be loaded onto the processor 1003.

The wireless device 1001 may also include a transmitter 1011 and a receiver 1013 to allow transmission and reception of signals to and from the wireless device 1001. The transmitter 1011 and receiver 1013 may be collectively referred to as a transceiver 1015. An antenna 1017 may be electrically coupled to the transceiver 1015. The wireless device 1001 may also include multiple transmitters, multiple receivers, multiple transceivers and/or multiple antennas (not shown).

The various components of the wireless device 1001 may be coupled together by one or more buses, which may include a power bus, a control signal bus, a status signal bus, a data bus, etc. For the sake of clarity, the various buses are illustrated in FIG. 10 as a bus system 1019.

In this specification and the appended claims, it should be clear that the term "circuitry" is construed as a structural term and not as a functional term. For example, circuitry can be an aggregate of circuit components, such as a multiplicity of integrated circuit components, in the form of processing and/or memory cells, units, blocks and the like, such as shown and described in FIG. 10. Examples of circuitry include, but are not limited to, a processor, memory, an analog to digital converter (ADC) and a transceiver.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 3, 5, 7 and 8, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for reducing spurs within a transmit signal comprising:
   determining a cancelling tone;
   adding the cancelling tone to a baseband transmit signal in the digital domain to obtain a baseband transmit signal with cancelling tone;
   reducing a spur in the transmit signal using the cancelling tone by:
      modulating the baseband transmit signal with canceling tone to form a modulated baseband transmit signal with canceling tone;
      converting the modulated baseband transmit signal with cancelling tone from a digital signal to an analog transmit signal using a digital to analog converter (DAC); and
      mixing the analog transmit signal with a local oscillator signal generated by a voltage controlled oscillator (VCO) and a phase locked loop (PLL) to form a mixed transmit signal, the local oscillator signal comprising a local oscillator frequency and at least one spur at multiples of the local oscillator frequency;
   amplifying the mixed transmit signal to form the transmit signal with the reduced spur; and
   transmitting the transmit signal with the reduced spur using an antenna.

2. The method of claim 1, wherein determining a cancelling tone comprises selecting a frequency of the cancelling tone.

3. The method of claim 1, wherein determining a cancelling tone comprises determining an amplitude of the cancelling tone.

4. The method of claim 1, wherein determining a cancelling tone comprises selecting a phase of the cancelling tone.

5. The method of claim 1, wherein a spur in the mixed transmit signal is reduced by the cancelling tone.

6. The method of claim 1, further comprising:
   determining an amplitude of a spur in a received signal;
   adjusting an amplitude of the cancelling tone to match the amplitude of the spur; and
   iteratively repeating to optimize spur reduction in the transmit signal.

7. The method of claim 6, wherein the received signal is received from a duplexer.

8. The method of claim 6, wherein determining the amplitude of the spur in the received signal comprises:
   mixing the received signal with a receiver local oscillator signal at a spur frequency to obtain a mixed received signal;
   filtering the mixed received signal;
   converting the mixed received signal from an analog signal to a digital signal using an analog to digital converter (ADC); and
   determining the amplitude of the spur using digital signal processing.

9. The method of claim 8, wherein a mobile station modem (MSM) sets the magnitude of a gain applied to the cancelling tone.

10. The method of claim 6, further comprising:
    shifting the frequency of the baseband transmit signal to obtain the cancelling tone; and
    amplifying the cancelling tone using a variable gain amplifier.

11. The method of claim 1, wherein the cancelling tone has a non-flat top to compensate for baseband filter attenuation over frequency.

12. The method of claim 1, wherein the spur is a single tone spur and the cancelling tone is a single tone cancelling tone.

13. The method of claim 1, wherein the spur is a wideband spur and the cancelling tone is a wideband canceling sideband.

14. The method of claim 1, wherein the method is performed on a wireless communication device.

15. The method of claim 1, wherein the method is performed by a transmit signal chain without a surface acoustic wave (SAW) filter.

16. A wireless device configured for reducing spurs within a transmit signal comprising:
    circuitry configured to:
       determine a cancelling tone;
       add the cancelling tone to a baseband transmit signal in the digital domain to obtain a baseband transmit signal with cancelling tone; and reduce a spur in the transmit signal using the cancelling tone by:
  modulating the baseband transmit signal with canceling tone to form a modulated baseband transmit signal with canceling tone;
  converting the modulated baseband transmit signal with cancelling tone from a digital signal to an analog transmit signal using a digital to analog converter (DAC); and
  mixing the analog transmit signal with a local oscillator signal generated by a voltage controlled oscillator (VCO) and a phase locked loop (PLL) to form a mixed transmit signal, the local oscillator signal comprising a local oscillator frequency and at least one spur at multiples of the local oscillator frequency; and
amplify the mixed transmit signal to form the transmit signal with the reduced spur; and
a transmitter configured to transmit the transmit signal with the reduced spur.

17. The wireless device of claim 16, wherein determining a cancelling tone comprises selecting a frequency of the cancelling tone.

18. The wireless device of claim 16, wherein determining a cancelling tone comprises determining an amplitude of the cancelling tone.

19. The wireless device of claim 16, wherein determining a cancelling tone comprises selecting a phase of the cancelling tone.

20. The wireless device of claim 16, wherein a spur in the mixed transmit signal is reduced by the cancelling tone.

21. The wireless device of claim 16, further comprising:
an adjustable amplifier configured to adjust an amplitude of the cancelling tone to match an amplitude of the spur.

22. The wireless device of claim 21, further comprising a duplexer used to receive a received signal.

23. The wireless device of claim 21, wherein the circuitry is further configured to determine the amplitude of the spur in a received signal, and wherein determining the amplitude of the spur comprises:
  mixing the received signal with a spur frequency to obtain a mixed received signal;
  filtering the mixed received signal;
  converting the mixed received signal from an analog signal to a digital signal using an analog to digital converter (ADC); and
  determining the amplitude of the spur using digital signal processing.

24. The wireless device of claim 23, wherein a mobile station modem (MSM) sets the magnitude of a gain applied to the cancelling tone.

25. The wireless device of claim 21, wherein the circuitry is further configured to:
  shift the frequency of the baseband transmit signal to obtain the cancelling tone; and
  amplify the cancelling tone using a variable gain amplifier.

26. The wireless device of claim 16, wherein the cancelling tone has a non-flat top to compensate for baseband filter attenuation over frequency.

27. The wireless device of claim 16, wherein the spur is a single tone spur and the cancelling tone is a single tone cancelling tone.

28. The wireless device of claim 16, wherein the spur is a wideband spur and the cancelling tone is a wideband cancelling sideband.

29. A wireless device configured for reducing spurs within a transmit signal, comprising:
  means for determining a cancelling tone;
  means for adding the cancelling tone to a baseband transmit signal in the digital domain to obtain a baseband transmit signal with cancelling tone;
  means for reducing a spur in the transmit signal using the cancelling tone, comprising:
    means for modulating the baseband transmit signal with canceling tone to form a modulated baseband transmit signal with canceling tone;
    means for converting the modulated baseband transmit signal with cancelling tone from a digital signal to an analog transmit signal using a digital to analog converter (DAC); and
    means for mixing the analog transmit signal with a local oscillator signal generated by a voltage controlled oscillator (VCO) and a phase locked loop (PLL) to form a mixed transmit signal, the local oscillator signal comprising a local oscillator frequency and at least one spur at multiples of the local oscillator frequency;
  means for amplifying the mixed transmit signal to form the transmit signal with the reduced spur; and
  means for transmitting the transmit signal with the reduced spur using an antenna.

30. A non-transitory computer-readable medium encoded with computer-executable instructions for:
  determining a cancelling tone;
  adding the cancelling tone to a baseband transmit signal in the digital domain to obtain a baseband transmit signal with cancelling tone;
  reducing a spur in the transmit signal using the cancelling tone by:
    modulating the baseband transmit signal with canceling tone to form a modulated baseband transmit signal with canceling tone;
    converting the modulated baseband transmit signal with cancelling tone from a digital signal to an analog transmit signal using a digital to analog converter (DAC); and
    mixing the analog transmit signal with a local oscillator signal generated by a voltage controlled oscillator (VCO) and a phase locked loop (PLL) to form a mixed transmit signal, the local oscillator signal comprising a local oscillator frequency and at least one spur at multiples of the local oscillator frequency;
  amplifying the mixed transmit signal to form the transmit signal with the reduced spur; and
  transmitting the transmit signal with the reduced spur using an antenna.

* * * * *